United States Patent
Chen et al.

(10) Patent No.: US 6,790,770 B2
(45) Date of Patent: Sep. 14, 2004

(54) METHOD FOR PREVENTING PHOTORESIST POISONING

(75) Inventors: Chao-Cheng Chen, Maton (TW); Jen-Cheng Liu, Hsin-Chu (TW); Jyu-Horng Shieh, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 164 days.

(21) Appl. No.: 10/035,690

(22) Filed: Nov. 8, 2001

(65) Prior Publication Data

US 2003/0087518 A1 May 8, 2003

(51) Int. Cl.[7] .......................................... H01L 21/4763
(52) U.S. Cl. ...................................... 438/637; 430/316
(58) Field of Search ................................ 438/622–624, 438/626, 631, 637, 645, 687, 118; 430/316–317; 257/324, 635, 752, 773, 758–760

(56) References Cited

U.S. PATENT DOCUMENTS

| | | | | |
|---|---|---|---|---|
| 6,042,999 A | * | 3/2000 | Lin et al. | 430/316 |
| 6,103,456 A | * | 8/2000 | Tobben et al. | 430/317 |
| 6,251,774 B1 | * | 6/2001 | Harada et al. | 438/637 |

* cited by examiner

*Primary Examiner*—David Nelms
*Assistant Examiner*—David Vu
(74) *Attorney, Agent, or Firm*—Tung & Associates

(57) ABSTRACT

A method if provided for improving a photolithographic patterning process in a dual damascene process by forming a resinous plug in a via opening to prevent out diffusion of nitrogen containing species from a low-k IMD layer in subsequent lithographic patterning and RIE etching processes to form a trench opening formed substantially over the via opening.

20 Claims, 1 Drawing Sheet

METHOD FOR PREVENTING PHOTORESIST POISONING

FIELD OF THE INVENTION

This invention generally relates to photolithographic patterning of semiconductor features and more particularly to an improved method for manufacturing features such as dual damascene structures while eliminating problems caused by undeveloped photoresist.

BACKGROUND OF THE INVENTION

Since the introduction of semiconductor devices, the size of semiconductor devices has been continuously shrinking, resulting in smaller semiconductor chip size and increased device density. One of the limiting factors in the continuing evolution toward smaller device size and higher density has been the stringent requirements placed on photolithographic processes as line width and step heights have decreased for device features. As one way to overcome such limitations, various methods have been implemented to increase the resolution performance of photoresists and to eliminate interfering effects occurring in the semiconductor wafer manufacturing process.

In the fabrication of semiconductor devices multiple layers may be required for providing a multi-layered interconnect structure. During the manufacture of integrated circuits it is common to place material photoresist on top of a semiconductor wafer in desired patterns and to etch away or otherwise remove surrounding material not covered by the resist pattern in order to produce metal interconnect lines or other desired features. During the formation of semiconductor devices it is often required that the conductive layers be interconnected through holes in an insulating layer. Such holes are commonly referred to as vias, i.e., when the hole extends through an insulating layer between two conductive areas. Electrical interconnecting lines (trench lines) are typically formed over the vias to electrically interconnect the various semiconductor devices within and between multiple layers. The damascene process is a well known semiconductor fabrication method for forming electrical interconnects between layers by forming vias and trench lines.

For example, in the dual damascene process, a via is etched in an insulating layer also known as an inter-metal or inter-level dielectric (IMD/ILD) layer. The insulating layer is typically formed over a metal or conductive layer. After a series of photolithographic steps defining via openings and trench openings, the via openings and the trench openings are filled with a metal (e.g., Al, Cu) to form vias and trench lines, respectively. The excess metal above the trench level is then removed by well known chemical-mechanical polishing (CMP) processes.

In a typical damascene process, for example, a dual damascene manufacturing process known in the art as a via-first-trench last process, conventional photolithographic processes using a photoresist layer is first used to expose and pattern an etching mask on the surface of an etching stop (hard mask) layer overlying the insulating (IMD/ILD) layer, for etching via openings through the insulating layer. Subsequently a similar process is used to define trench openings that are formed substantially over the via openings which in turn define metallic interconnect lines. The via openings and trench openings are subsequently filled with metal to form vias and metal interconnect (trench) lines. The surface may then be planarized by conventional techniques to better define the metal interconnect lines and prepare the substrate for further processing.

One problem with the dual damascene process, especially where vias are adjacent to one another thereby making the distance between metal interconnect lines critical as design rules are scaled down, has been the phenomenon of coherent interference effects forming standing waves in the photoresist due to a reflecting underlayer, e.g., the insulating IMD/ILD layer. Light reflecting from an underlying substrate can lead to size variations in the photoresist pattern making it difficult for critical dimension (CD) control. Efforts to address this problem have included adding dielectric anti-reflectance coating (DARC) layers, for example, silicon oxynitride (SiON), over the insulating layer prior to laying down a photoresist layer, thereby reducing unwanted light reflections.

As an example of a typical dual damascene process, for example, a via-first process, a substrate having a first metallic layer is provided. Next, an insulating layer is formed over the substrate, followed by planarization so that the insulating layer thickness matches the depth of the desired via openings. Thereafter, an hard mask metal nitride layer of, for example, silicon nitride or silicon oxynitride, is formed over the insulating layer which may function as a hard mask in the patterning process to define the via openings. A DARC layer is then deposited over the hard mask layer. Next, a photoresist layer is formed over the DARC layer, which is subsequently patterned for etching via openings and which acts as an etching mask together with the hard mask layer during the etching process. The patterned DARC layer, hard mask layer and insulating layer are then anisotropically etched through a thickness to form via openings through the hard mask layer and insulating layer, with the resulting via openings in closed communication with the underlying conductive layer.

After the via holes are etched, but before the holes are filled with a conductive material, for example, copper, the photoresist mask which remains on top of the desired features may be removed by a dry etching method known as a reactive ion etch (RIE) or ashing process using a plasma formed of $O_2$ or a combination of $CF_4$ and $O_2$ to react with the photoresist material.

As feature sizes in etching process have become increasingly smaller, photolithographic processes have been required to use photoresist activating light (radiation) of smaller wavelength. Typically a deep ultraviolet (DUV) activating light source with wavelength less than about 250, but more typically, from about 193 nm to about 230 nm is used. Exemplary DUV photoresists, for example, include PMMA and polybutene sulfone.

Many processes use a metal nitride as a dielectric anti-reflectance coating (DARC) such as silicon oxynitride (e.g., SION), silicon nitride (e.g., SiN), or titanium nitride (e.g., TiN). Typically, the method of choice for depositing these metal nitride layers is a CVD process where for example, a metal-organic precursor together with nitrogen (and oxygen in the case of SiON) is deposited on a substrate surface, to form a metal nitride. Silicon oxynitride DARC, has been widely used for DUV (deep ultraviolet) lithography because of its tunable refractive index and high etch selectivity to resist.

One problem affecting DUV photoresist processes has been the interference of residual nitrogen-containing species with the DUV photoresist. Residual nitrogen-containing contamination is one of the greater concerns in the use or application of metal nitride films such as silicon nitride or silicon oxynitride as hard mask layer or silicon oxynitride as a DARC. For example, nitrogen radicals created due to the presence of nitrogen containing species, such as amines, interfere with chemically amplified resists by neutralizing the acid catalyst, thereby rendering that portion of the photoresist insoluble in the developer. As a result, residual photoresist may remain on patterned feature edges, walls, or floors of features, affecting subsequent etching or metal filling processes thereby degrading electrical property functionality by causing, for example, electrical open circuits or increased resistivity.

Another aspect of advances in semiconductor device processing technology that exacerbates the problem is the increasing use of low-k (low dielectric constant) insulating materials that make up the bulk of a multilayer device. In order to reduce signal delays caused by parasitic effects related to the capacitance of insulating layers, for example, IMD layers, incorporation of low-k materials have become standard practice as semiconductor feature sizes have diminished. Many of the low-k materials are designed with a high degree of porosity including interconnecting porosity to allow the achievement of lower dielectric constants. An exemplary low-k material is, for example, carbon doped silicon dioxide (C-oxide) which has a dielectric of about 3 or lower and density of about 1.3 g/cm$^3$ compared to dielectric constants of about 4.1 and a density of about 2.3 g/cm$^3$ for silicon dioxides (e.g., un-doped TEOS). A shortcoming of porous low-k materials is that they readily absorb and provide diffusion pathways through interconnecting pores for chemical species.

As a result, amine and nitrogen-containing species present during the formation of, for example, a SiON hard mask layer or DARC layer, may readily diffuse into adjacent insulating layers, thereby available for interfering with subsequent photoresist processes, such as trench line patterning. The contaminating nitrogen-containing species may diffuse back out of the IMD layer during the photoresist process causing residual exposed but undeveloped photoresist to remain following development, thereby "poisoning vias" by altering remaining deposited on feature edges, sidewalls, and floors. As a result, subsequent metal filling operations of the via openings and trench line openings may result in an open electrical connections or at least increased resistivity in the electrical interconnects.

Another factor which may contribute to the occurrence of undeveloped photoresist remaining on photo-patterned features, for example, dual damascene structures, is related to the ability of the photolithography process to adequately expose the feature patterns. As feature sizes decrease, for example, photolithographic processes have been pushed to their limit. For example, there are well known mathematical relations that predict lithographic imaging behavior, putting constraints on the actual exposure of a given patterned feature due to considerations of depth of focus (DOF) and numerical aperture (NA) of the imaging system. For example, in a dual damascene process the step height of the via may affect subsequent lithographic patterning of an overlying trench line. Decreasing the step height of a via opening would improve exposure conditions of an overlying trench line.

There is therefore a need in the semiconductor processing art to develop a method whereby reliable photolithography processes may be carried out without the detrimental effects of photoresist poisoning caused by undeveloped photoresist remaining on patterned features.

It is therefore an object of the invention to provide a method to develop a method whereby reliable photolithography processes may be carried out without the detrimental effects of photoresist poisoning caused by undeveloped photoresist remaining on patterned features.

SUMMARY OF THE INVENTION

To achieve the foregoing and other objects, and in accordance with the purposes of the present invention, as embodied and broadly described herein, the present invention provides a method for preventing the occurrence of undeveloped photoresist in semiconductor manufacturing processes.

In a first embodiment of the present invention a method is provided for improving a photolithographic patterning process in a dual damascene process including providing at least one via opening extending through a thickness of layers sequentially including a dielectric anti-reflectance layer (DARC), a hard mask layer, and an insulating layer said via opening in closed communication with a conductive region underlying the insulating layer; forming a resinous layer over the DARC layer to include filling the at least one via opening; removing the resinous layer overlying the at least one via opening to form at least one via plug; forming a photoresist layer over the DARC layer for photolithographically patterning a trench line opening disposed substantially over the at least one via opening; photolithographically forming a trench line opening disposed substantially over the at least one via opening to expose a portion of the DARC layer forming a trench line pattern; anisotropically etching according to the trench line pattern through at least a thickness of the DARC layer and hard mask layer to include a portion of the at least one via plug; and anisotropically etching according to the trench line pattern through a portion of a thickness of the insulating layer to form a trench line opening disposed substantially over a remaining portion of the at least one via opening.

In related embodiments the insulating layer has a dielectric constant of less than about 3.0. Further, the insulating layer includes a porous material including interconnecting pores. Further yet, the insulating layer comprises carbon doped oxide.

In other related embodiments, the hard mask layer and DARC layer include a metal nitride. Further, the metal nitride is selected from the group consisting of silicon nitride, silicon oxynitride and titanium nitride. Further yet, the metal nitride is deposited according to a chemical vapor deposition process.

In yet other related embodiments, the resinous layer includes a photoresist resin flowable at room temperature.

In another embodiment, the step of anisotropically etching through a thickness of the DARC layer and hard mask layer to include a portion of the via plug further comprises reactive ion etching (RIE) with an etching chemistry whereby the etching selectivity of the via plug to the hard mask is greater than about 1. Further, the step of anisotropically etching through a thickness of the DARC layer and hard mask layer to include a portion of the via plug further comprises reactive ion etching (RIE) with a nitrogen and oxygen containing plasma having a nitrogen to oxygen ratio of at least about 5.

These and other embodiments, aspects and features of the invention will become better understood from a detailed description of the preferred embodiments of the invention which is described below in conjunction with the accompanying drawings.

DETAILED DESCRIPTION OF THE PREFERRED EMBODIMENTS

The method according to the present invention is more clearly described by referring to FIGS. 1A–1H which depict portions of a semiconductor device in different stages in the manufacturing process including the method according to the present invention.

Figure 1A:
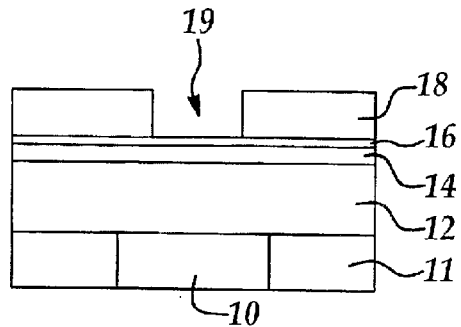
FIGS. 1A–1B are representative cross sectional side views of a portion of a dual damascene structure at stages in the manufacturing process.

For example, referring to FIG. 1A, is shown a portion of a dual damascene structure, for example, including a conductive region 10, for example, copper, formed in an insulating layer 11 and an overlying insulating (IMD) layer 12, for example a low-k carbon doped silicon dioxide. Although several different insulating materials may be used in the IMD layer, preferably a low-k (low dielectric constant material) is used, for example, carbon doped silicon dioxide (C-oxide). Preferably the dielectric constant of the low-k material is less than about 3.0. It will be appreciated that other low-k materials may be used and that the method according to the present invention is likewise applicable to those materials, particularly if they are porous materials. For example, the low-k material may include interconnecting pores having a pore size of at least about 10 Angstroms thereby allowing chemical species such as nitrogen containing species to diffuse therethrough. It will also be appreciated that the amount of carbon doping may be varied in the IMD layer 12. Additional exemplary low-k inorganic materials include, for example, porous oxides, xerogels, or SOG (spin-on glass). Exemplary low-k organic materials include, for example, polysilsequioxane, parylene, polyimide, benzocyclobutene and amorphous Teflon.

A metal nitride etching stop layer (hard mask layer) 14, for example, silicon nitride (e.g., $Si_3N_4$) or silicon oxynitride (e.g., SiON) is deposited over the IMD layer 12. The metal nitride layer is typically deposited by a (chemical vapor deposition (CVD) process including for example, PECVD (plasma enhanced CVD), LPCVD (low pressure CVD), or HDPCVD (high density plasma CVD) by reacting silane ($SiH_4$) or an amine-containing metal-organic precursor with ammonia ($NH_3$) or nitrogen, and including oxygen in the case the metal nitride is oxygen containing such as silicon oxynitride, under conditions that are well known in the art.

A dielectric anti-reflectance coating (DARC) layer 16 is then deposited over the hard mask layer 14, to reduce undesired light reflections in a subsequent photolithographic patterning process to define via openings. Preferably, the DARC layer 16 is silicon oxynitride (SiON), but may be other metal nitrides, such as Titanium nitride (e.g., TiN). The DARC layer 16 and the hard mask layer 14 each are typically within a thickness range of about 200 to about 1000 Angstroms.

A photoresist layer 18 is next deposited over the DARC layer and exposed and developed according to a conventional photolithographic process to define via openings, for example, via opening pattern 19. Preferably, a deep ultraviolet (DUV) activating radiation source with a wavelength of less than about 250 nm, is used to expose the photoresist layer 18 to form the via opening etching pattern. The photoresist may be any conventional DUV photoresist including, for example, a chemically amplified resist including a photogenerated acid. There are several suitable commercially available photoresists including for example, PMMA and polybutene sulfone.

Figure 1B:
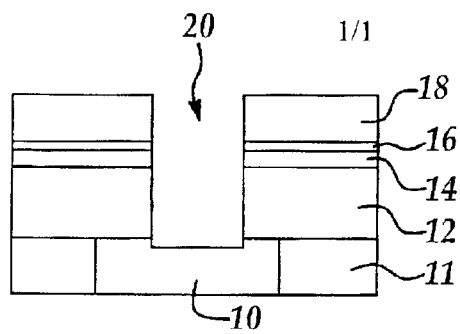

As shown in FIG. 1B, via opening 20 is anisotropically etched through a thickness of the DARC layer 16, the hard mask layer 14, and the IMD layer 12 to create a hole in closed communication with the underlying conductive region 10. The anisotropic etching is typically carried out by a conventional plasma reactive ion etch (RIE) process.

Figure 1C:
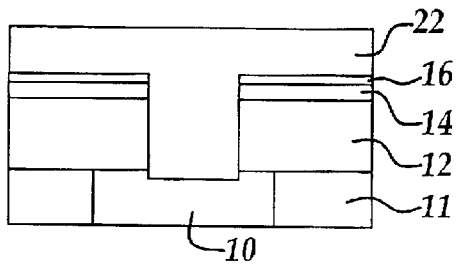
FIGS. 1C–1H are representative cross sectional side views of a portion of a dual damascene structure at stages in the manufacturing process according to the present invention.

Turning to FIG. 1C, in the method according to the present invention, after removing the photoresist layer 18 by either a wet chemical process or preferably a plasma ashing process, a flowable photoresist layer 22 (I-line photoresist), for example, an I-line resin such as a conventional Novolac resin, is deposited over the via opening 20 to fill the via opening 20 and form a second photoresist layer 22 over the DARC layer 16. A conventional spin coating process may be used to apply I-line photoresist layer 22. The photoresist layer 22 is deposited within a range of about 1000 to about 4000 Angstroms. The I-line photoresist layer 22 filling via opening 20 operates to block out-diffusion of nitrogen containing species that have been absorbed into the low-k IMD layer 12 during the deposition of metal nitride layers, for example the hard mask layer 14, and DARC layer 16. As a result, interference with subsequent DUV photolithographic patterning processes, to define, for example a trench line, is obviated.

Figure 1D:
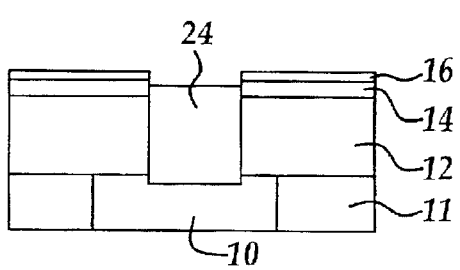

Following deposition of the I-line photoresist layer 22, an etch back process is carried out to remove the photoresist layer 22 overlying the filled via opening 20 and is further etched through to endpoint detection of the of the metal nitride SiON layer 14. The etch back is carried out such that at least the via opening 20 adjacent the IMD layer 12 remains filled (plugged) to include covering the via sidewalls to form via plug 24 as shown in FIG. 1D. The etch back process is carried out by a conventional RIE process, with for example an oxygen plasma or a fluorine based chemistry such as $CF_4$, and $CHF_3$ with oxygen. The I-line photoresist plug 24 filling via opening 20, acts to reduce the step height in a subsequent trench patterning process thereby improving optical exposure conditions for trench patterning.

Figure 1E:
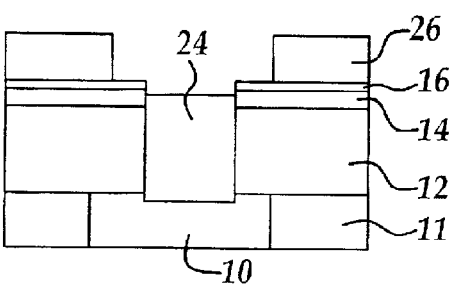

Following the etch back process, a DUV photoresist layer 26 (trench line photoresist) is deposited over the DARC layer 16 and photolithographically patterned by DUV exposure and development to form a pattern for trench line formation over via plug 24 as shown in FIG. 1E. Preferably the DUV photoresist is a photoresist designed for exposure and development at a wavelength less than about 250 nm as discussed with reference to via photoresist layer 18 in FIG. 1A.

Figure 1F:
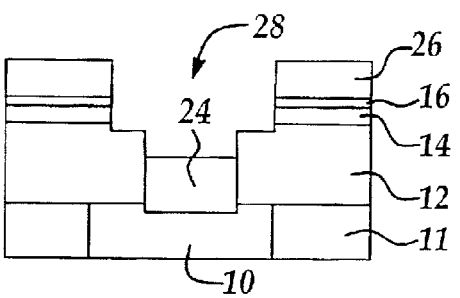

A plasma RIE process (I-line etching) is then carried out to etch through the exposed DARC layer 16 and etching stop (hard mask) layer 14, to include partially etching through via plug 24, and IMD layer 12 to partially form a trench opening 28 as shown in FIG. 1F. The plasma etching chemistry preferably has an etching selectivity of I-line photoresist to hard mask of greater than 1. The plasma etching chemistry preferably includes a nitrogen rich chemistry with a smaller amount of oxygen with a nitrogen to oxygen ratio of about 5 to about 10. For example, suitable conditions for etching through metal nitride layers include pressures that are from about 40 to about 100 millitorr. Suitable levels of microwave power supplied to the plasma are from 1000 to about 1500 Watts. Further, a nitrogen flow rate is preferably supplied at a flow rate from about 50 to about 300 sccm with an oxygen flow rate from about 2 to about 10 sccm. After etching through the metal nitride layers, the etching chemistry may include hydrogen to replace at least a portion of the oxygen. During the I-line etching process, a portion of the trench line photoresist layer 26, IMD layer 12, and via plug 24, are removed as seen in FIG. 1F.

Figure 1G:
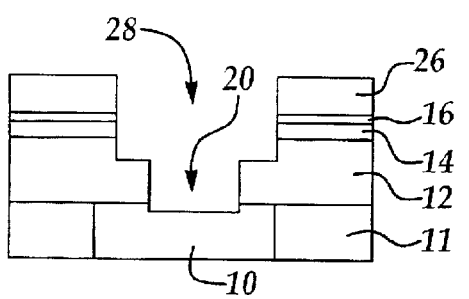

Following, the I-line RIE etching process a trench line RIE etching process is carried out to complete the etching of the trench line opening 28 as shown in FIG. 1G, leaving a portion of the via plug 24 at the bottom of via opening 20. The trench line etching process preferably includes hydro fluorocarbons such as $C_xF_Y$, with a fluorine to carbon ratio of at least about 2 together with a nitrogen to oxygen ration of about 5 to about 10.

Figure 1H:
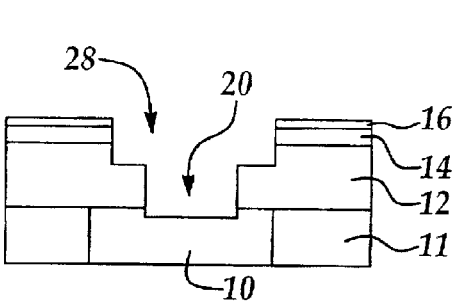

Following the trench line etching process, a conventional RIE ashing and cleaning process in an oxygen rich plasma is carried out to remove remaining via plug 24 from the via opening 20 and the trench line photoresist layer 26 as shown in FIG. 1H.

The dual damascene structure is typically completed forming a barrier layer (not shown) over the floor and sidewalls of the trench line opening 28 and via opening 20 followed by filling with a metal, for example copper, and planarizing with a chemical mechanical polishing (CMP) process.

Thus, the method according to the present invention provides a method whereby reliable photolithography processes in, for example, a dual damascene process may be reliably carried out without the detrimental effects of photoresist poisoning caused by undeveloped photoresist remaining on patterned features. The method according to the present invention operates to block out-diffusion of nitrogen containing species that have been absorbed into low-k insulating layers during the deposition of metal nitride layers, thereby obviating the interfering effects of such species with subsequent photoresist processes. In addition, the via opening step height is reduced thereby improving optical exposure conditions for trench patterning.

The preferred embodiments, aspects, and features of the invention having been described, it will be apparent to those skilled in the art that numerous variations, modifications, and substitutions may be made without departing from the spirit of the invention as herein disclosed and more particularly claimed below.

What is claimed is:

1. A method for improving a photolithographic patterning process in a dual damascene process comprising the steps of:

providing a via opening extending through a thickness of layers comprising a dielectric anti-reflectance layer (DARC), and a dielectric insulating layer;

forming a resinous layer over the DARC layer to include filling the via opening;

removing the resinous layer to expose the DARC layer to form a via plug covering at least the dielectric insulating layer portion of the via sidewalls;

forming a photoresist layer over the DARC layer for photolithographically patterning a trench line opening disposed substantially over the via opening;

photolithographically forming a trench line opening disposed substantially over the via opening to expose a portion of the DARC layer forming a trench line pattern;

etching according to the trench line pattern through at least a thickness of the DARC layer to include a portion of the via plug; and, etching according to the trench line pattern through a thickness portion of the dielectric insulating layer to form a trench line opening disposed substantially over a remaining portion of the via opening.

2. The method of claim 1, wherein the dielectric insulating layer has a dielectric constant of less than about 3.0.

3. The method of claim 2, wherein the dielectric insulating layer comprises an interconnecting porous material.

4. The method of claim 2, wherein the dielectric insulating layer comprises carbon doped oxide.

5. The method of claim 1, wherein the DARC layer comprises a metal nitride.

6. The method of claim 5, wherein the metal nitride is deposited according to a chemical vapor deposition process.

7. The method of claim 1, wherein the DARC layer is selected from the group consisting of silicon oxynitride and titanium nitride.

8. The method of claim 1, wherein the resinous layer comprises a photoresist resin.

9. The method of claim 1, wherein the step of etching through a thickness of the DARC layer and hard mask layer to include a portion of the via plug comprises reactive ion etching (RIE) with a nitrogen and oxygen containing plasma having a nitrogen to oxygen ratio of at least about 5.

10. The method of claim 9, said plasma further including hydrogen.

11. The method of claim 1, further comprising an ashing and cleaning process to remove the via plug following the step of etching through the insulating layer to form a trench line.

12. The method of claim 1, wherein the resinous layer is selected from the group consisting of an I-line photoresist, and a Novolac resin.

13. The method of claim 1, wherein the thickness of layers further comprises a metal nitride hardmask layer underlying the DARC layer.

14. The method of claim 1, wherein the step of removing the resinous layer comprises an RIE etchback process.

15. The method of claim 14, wherein the etchback process is carried out to endpoint detection of the DARC layer.

16. A method for preventing the occurrence of undeveloped photoresist in semiconductor manufacturing process comprising the steps of:

providing a first opening extending through a thickness comprising an uppermost DARC metal nitride layer and a dielectric insulating layer;

forming an I-line photoresist layer over the DARC metal nitride layer to include filling the first opening;

removing the I-line photoresist layer to expose the DARC metal nitride layer to form a plug filling the first opening at least up to an upper level of the dielectric insulating layer;

forming a DUV photoresist layer over the at least one metal nitride layer for lithographically patterning a second opening disposed over the first opening;

lithographically patterning a second opening disposed over the first opening to expose a portion of the DARC metal nitride layer forming an etching pattern;

etching according to the etching pattern through at least a thickness of the DARC metal nitride layer to include at least a portion of the plug; and, etching according to the etching pattern through a thickness portion the dielectric insulating layer to form the second opening and a remaining portion of the first opening said second opening disposed substantially over the remaining portion of the first opening.

17. The method of claim 16, wherein the dielectric insulating layer has a dielectric constant of less than about 3.0.

18. The method of claim 17, wherein the dielectric insulating layer comprises a porous material including interconnecting pores.

19. The method of claim 17, wherein the dielectric insulating layer comprises carbon doped oxide.

20. The method of claim 16, wherein the DARC metal nitride is selected from the group consisting of silicon oxynitride and titanium nitride.

* * * * *